US008506120B2

(12) United States Patent
Jensen et al.

(10) Patent No.: US 8,506,120 B2

(45) Date of Patent: Aug. 13, 2013

(54) ADAPTER WITH AT LEAST ONE ELECTRONIC COMPONENT

(75) Inventors: Kai Rostrup Jensen, Struer (DK); Bent Gøbel, Struer (DK)

(73) Assignee: LEDlumina Technology A/S, Brondby (DK)

( * ) Notice: Subject to any disclaimer, the term of this patent is extended or adjusted under 35 U.S.C. 154(b) by 359 days.

(21) Appl. No.: 12/735,133

(22) PCT Filed: Nov. 27, 2008

(86) PCT No.: PCT/DK2008/050280

§ 371 (c)(1), (2), (4) Date: Jul. 28, 2010

(87) PCT Pub. No.: WO2009/076960

PCT Pub. Date: Jun. 25, 2009

(65) Prior Publication Data

US 2010/0293825 A1 Nov. 25, 2010

(30) Foreign Application Priority Data

Dec. 17, 2007 (DK) ................................ 2007 01806

(51) Int. Cl.

| | |
|---|---|
| ***H01R 12/00*** | (2006.01) |
| ***G09F 13/00*** | (2006.01) |
| ***F21S 4/00*** | (2006.01) |
| ***F21V 5/00*** | (2006.01) |
| ***H05K 7/00*** | (2006.01) |

(52) U.S. Cl.

USPC ...... 362/249.02; 362/218; 362/267; 362/294; 362/327; 362/311.02; 439/56

(58) Field of Classification Search

USPC ............... 362/218, 249.02, 267, 294, 311.02, 362/327

See application file for complete search history.

(56) References Cited

U.S. PATENT DOCUMENTS

| | | | | |
|---|---|---|---|---|
| 6,045,240 | A | 4/2000 | Hochstein | |
| 6,840,776 | B2 * | 1/2005 | Sørensen et al. | 439/56 |
| 7,440,280 | B2 * | 10/2008 | Shuy | 361/701 |
| 2010/0320892 | A1 * | 12/2010 | Yu | 313/46 |

FOREIGN PATENT DOCUMENTS

| | | |
|---|---|---|
| WO | 03017435 | 2/2003 |

* cited by examiner

*Primary Examiner* — Stephen F Husar

*Assistant Examiner* — James Cranson, Jr.

(74) *Attorney, Agent, or Firm* — James Creighton Wray

(57) ABSTRACT

An adapter (1) with at least one electronic component (2) for mounting in a hole (3) extending through or partly through a composite board (4), which includes at least two layers (5) of electrically conducting material that are separated by at least one insulator (6) of electrically insulating material, the adapter (1) including one or more legs (7) adapted for by mounting in the hole (2) to establish electric connection with a first layer (8), and where the at least one component (2) is fitted on a metal item (9) which has a contact surface, and that the contact surface is in electrically and thermally conducting connecting with a contact surface on a second layer (10) when the adapter (1) is mounted in the hole (3).

8 Claims, 3 Drawing Sheets

ADAPTER WITH AT LEAST ONE ELECTRONIC COMPONENT

This application claims the benefit of Danish Application No. PA 2007 01806 filed Dec. 17, 2007 and PCT/DK2008/050820 filed Nov. 27, 2008, which are hereby incorporated by reference in their entirety as if fully set forth herein.

FIELD OF THE INVENTION

The present invention concerns an adapter with at least one electronic component for mounting in a hole extending through or partly through a composite board, which includes at least two layers of electrically conducting material that are separated by at least one insulator of electrically insulating material, the adapter including one or more legs adapted for by mounting in the hole to establish electric connection with a first layer, and where between the adapter and the board there is provided a watertight barrier.

The invention furthermore comprises an adapter with at least one electronic component for mounting in a hole extending entirely through a board, which includes a layer of electrically conducting material, the adapter including one or more legs adapted to establish electric connection with an electric conductor by mounting in the hole, and where between the adapter and the board there is provided a watertight barrier.

BACKGROUND OF THE INVENTION

The trend in the development of light diodes is towards diodes with higher power. However, it has appeared that the service life of these diodes in conventional installations have been strongly reduced as the power has increased. It is assumed that this reduction in service life is caused by the heat development in the diode due to the higher power.

WO 03/017435 discloses an adapter for a light diode. The adapter is configured for installation in a board with two electrically conducting layers which are separated by an electrically insulating layer. The adapter has at least two legs for establishing electric contact between the two electrically conducting layer and the light diode. The advantage of this type of adapter is that it appreciably reduces the number of wires needed in connection with installing a large number of adapters in signs. The drawback of the adapter according to WO 03/017435 is that it is not suitable in connection with light diodes with high power, because it cannot dissipate the heat from these diodes efficiently enough. This entails great limitations in relation to the further development of diodes for light emitters in signs, displays and lighting fixtures.

OBJECT OF THE INVENTION

It is the object of the invention to indicate an adapter for an electronic component that enables both indoor and outdoor use of electronic components, e.g. light diodes which yield high power, and simultaneously reduces the number of separate electric conductors as much as possible.

DESCRIPTION OF THE INVENTION

According to the present invention, this is achieved by an adapter of the type specified in the introduction which is peculiar in that the at least one component is fitted on a metal item which has a contact surface, and that the contact surface is in electrically and thermally conducting connecting with a contact surface on a second layer when the adapter is mounted in the hole.

The heat conducting properties of the metal item is utilised for conducting the heat from the electronic component away from the adapter and into the board while simultaneously operating as an electric conductor. Hereby is achieved the possibility of producing a very efficient cooling of the component, and the main obstacle to the use of highpower components in the adapter of the type mentioned in the introduction is thus eliminated, while at the same time retaining the advantages of using the layers of electrically conducting material in the composite board as electric conductors.

The watertight barrier between the adapter and the board provides the option of disposing associated electric components and conductors behind the board without individual protection. The adapter may thus be used in indoor as well as outdoor installations.

The layer through which the electric contact is established may be different from the layer through which the thermal heat conduction from the component is established, but it will be preferred to design the adapter such that one and the same layer is used.

The composite board can be chosen with more layers and material compositions, depending on need and function. When using a composite board with more electrically conducting layers, the individual layer will be separated by an electrically insulating layer which is disposed between the conducting layers. Hereby it becomes possible to provide several components in the same adapter with separate power supply. The components may share a common connection to e.g. earth, 0 or negative pole through e.g. a first electrically conducting layer. Each additional layer then supplies power to its respective component or component cluster. A plurality of components in the same adapter may hereby be switched on and off and/or regulated independently of each other. The above described mode of operation applies to components with two connections. The adapter may also be supplied with components with more connections. The power supply to each connection is ensured in this case in a similar way by adapting the number of layers in the composite board to the number of connections.

The adapter may also be placed on a board of an electrically conducting layer. In this case, the contact surface of the adapter will provide electric and thermal connection to this layer, and the legs of the adapter will be connected to another electric conductor, e.g. by soldering or clamping a copper wire to the legs of the adapter.

The metal item may advantageously be made of aluminium which is a good heat conductor, besides being an economic material having a low specific density as well. Other metals, such as iron, copper or metal alloys may also be used. The cooling properties of the adapter can be improved by adding thermally and electrically conducting material between the component and the metal item.

According to a further embodiment, the adapter according to the invention is peculiar in that the component is a light diode. Hereby may be achieved possibility of using the adapter in light signs, lighting fixtures, displays or other installations where a light source is desired.

According to a further embodiment, the adapter according to the invention is peculiar in that the power of the light diode is at least 0.1 W, preferably a power from 0.3 W to 10 W. By using highpower light diodes, the adapter may be used in installations where there is desired a light emitter that provides a high luminous intensity compared with the power consumption. The luminous intensity of light diodes per power unit is strongly rising, and at the moment it is more than five times that of common incandescent light bulbs.

According to a further embodiment, the adapter according to the invention is peculiar in that the watertight barrier is a packing optionally selected among a rubber packing, an O-ring, a fluid packing, and a design of the metal item corresponding to the hole so as to constitute a watertight interference fit by interaction with the latter. The packing may in addition be chosen as a combination of the above, as it may be required to withstand the actions from outside. A rubber packing or an O-ring are both types of packings that are commercially available, thereby providing cheap alternatives. The fluid packing can be used in installations where a cheap packing is desired that can be made to resist high pressure, and where the adapter and the board are discarded if they become defective. If it is decided to design the sealing means as a watertight interference fit between the metal item and the board, some additional advantages are achieved. Preferably, the hole will be a cylindric hole and the electrically and thermally conduction contact surface will be a cylindric ring. Hereby, good heat transmission and electric conduction are ensured between the adapter and the thermally and electrically conducting layer of the composite board in a simple way. Besides, the interference fit functions as a watertight barrier towards the part of the hole located behind the metal item. The sealing means will often be a combination of a watertight interference fit between the metal item and the board and a rubber or O-ring packing.

According to a further embodiment, the adapter according to the invention is peculiar in that the component is provided with a watertight casing which optionally or in combination is established by a material being moulded directly on the component or by the component being enclosed by a cover provided on the adapter by interacting fastening means. Hereby is enabled using the adapter in the outdoors, or in environments where it is advantageous with a watertight encapsulation, for example due to chemical actions or great air humidity. If the watertight casing is chosen as a cover, it will be possible to replace it. This may be advantageous in connection with installations where the adapter is subjected to mechanical action, including actions by sand and dust.

According to a further embodiment, the adapter according to the invention is peculiar in that the watertight casing is provided in transparent material with optical properties selected among reflectors, Fresnel lenses, holographic filters, light guides, coloured lenses, semi-transparent lenses or combinations of these. Hereby is achieved that it becomes possible to configure the adapter to many different applications by adapting the optical properties to the installation. This may e.g. be the case in RGB displays where optical covers may contribute to suitable mixing of the light.

If the watertight casing is chosen as a cover, it will be possible to change the optical properties of the adapter in an easy way in combination with the above for adaptation to various applications.

The adapter is preferably used together with a plurality of adapters, preferably in lighting fixtures, light signs or RGB displays.

DESCRIPTION OF THE DRAWING

The invention will then be explained in more detail with reference to the accompanying drawing, where.

DESCRIPTION OF EXAMPLE EMBODIMENTS

Figure 1:
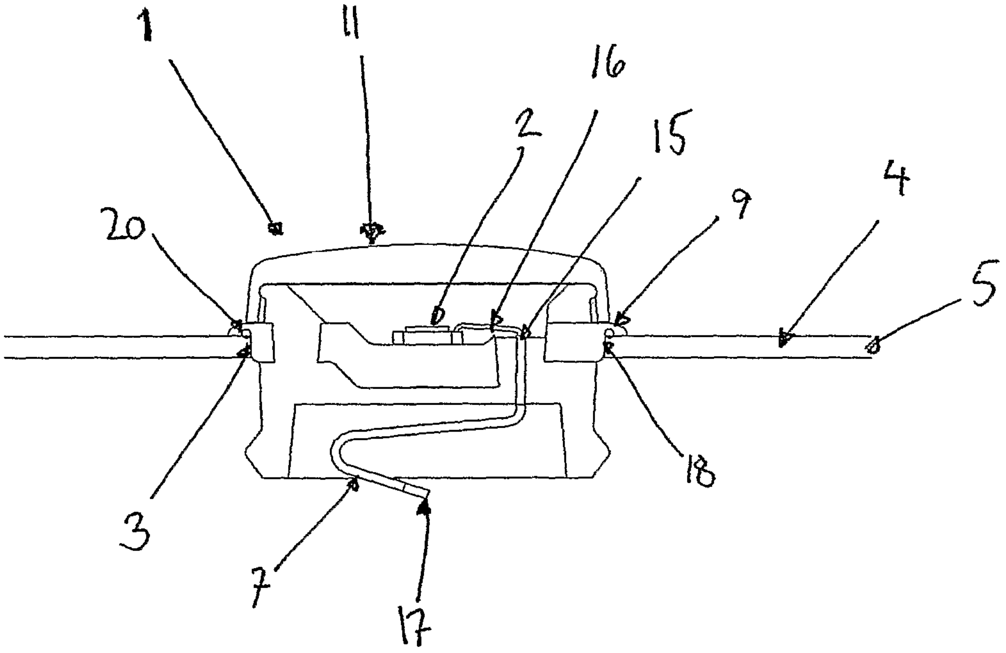
FIG. 1 shows a sectional view of the adapter which is installed in a single board.

On FIGS. 1-4 are seen an adapter 1 as disclosed by the invention. An electronic component 2 is provided on a metal item 9. The metal item 9 is disposed in a hole 3 in a board 4 consisting of a layer 5 of electrically conducting material. The adapter 1 is provided with one or more legs 7 which at one end 15 is provided with an electric connection 16 to the component 2 and which by its other end 17 establishes electric contact with an electric conductor (not shown). The component 2 has electric connection to the metal item 9 by its disposition on it. A thermally and electrically conducting layer 18 may be established between the component 2 and the metal item 9. The electric connection between the metal item 9 and the board 4 is established by designing the metal item 9 such that it corresponds to the hole 3 in the board 4, and then pressing the metal item 9 into the board 4. Different kinds of devices (not shown) can be used for securing the adapter in the hole, e.g. locking rings, screw threads, pins or binders, or a combination of several devices.

In the shown embodiment of the adapter 1, a watertight barrier 20 is disposed between the board 4 and a flange on the adapter 1. The watertight barrier 20 is shown as an O-ring, but may also be chosen from other embodiments. In a particular embodiment of the invention, the electric component 2 is a light diode 2.

Figure 2:
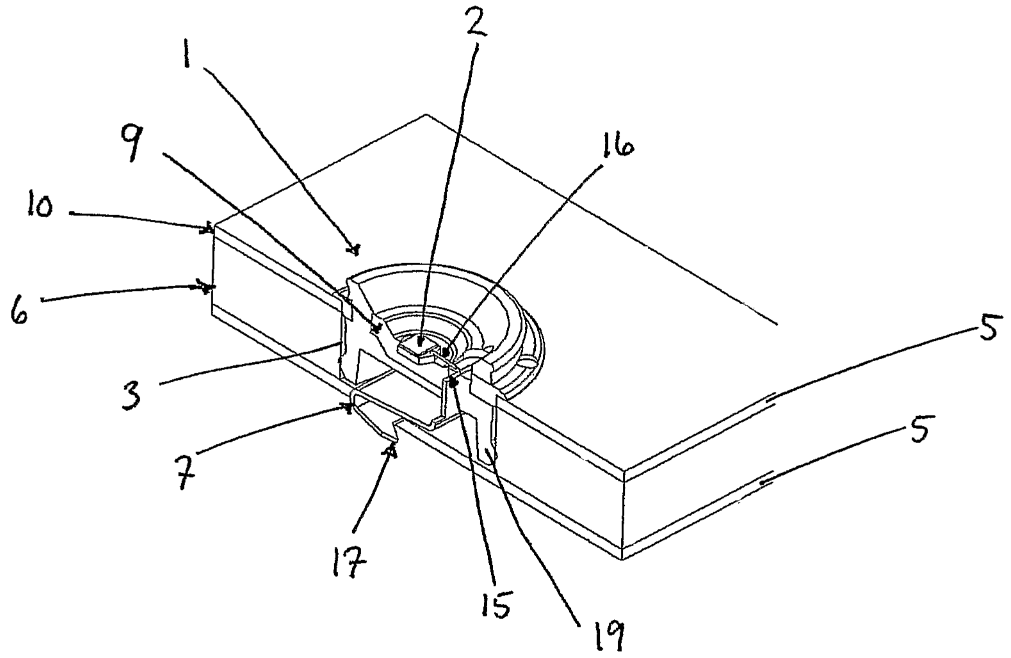
FIG. 2 shows an isometric sectional view of the adapter installed in a composite board.

On FIG. 2, the adapter 1 appears mounted in a hole 3 in a composite board 4 consisting of at least two layers 5 of electrically conducting material separated by an electrically insulating core 6. The adapter 1 is provided with one or more legs 7 which at one end 15 is provided with an electric connection 16 to the component 2 and which by its other end 17 establishes electric contact with one layer 8 of the composite board. The component 2 has electric connection to the metal item 9 through its disposition on it. A thermally and electrically conducting layer 18 may be established between the component 2 and the metal item 9. The electric connection between the metal item 9 and the other layer 10 of the composite board is established by designing the metal item 9 such that it corresponds to the hole 6 in the board 4, and pressing the metal item 9 into the composite board 4.

The adapter 1 may be provided with a housing 19 of an electrically insulating material, such as plastic. The housing 19 is used for ensuring the relative mutual disposition of the various elements of the adapter.

Figure 3:
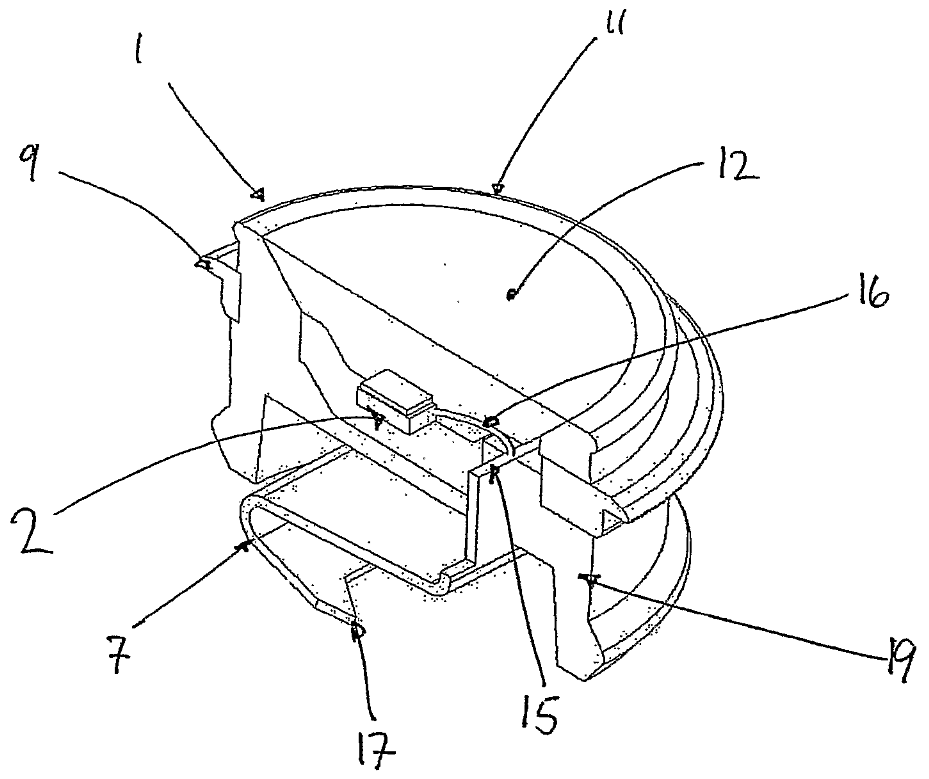
FIG. 3 shows an isometric sectional view of the adapter with top sealing.

The adapter 1 is provided with a watertight casing or encapsulation 11 for the component 2. On FIG. 3 is shown an embodiment of the adapter 1 where the watertight casing 11 is established by moulding a material 12 around the component 2.

Figure 4:
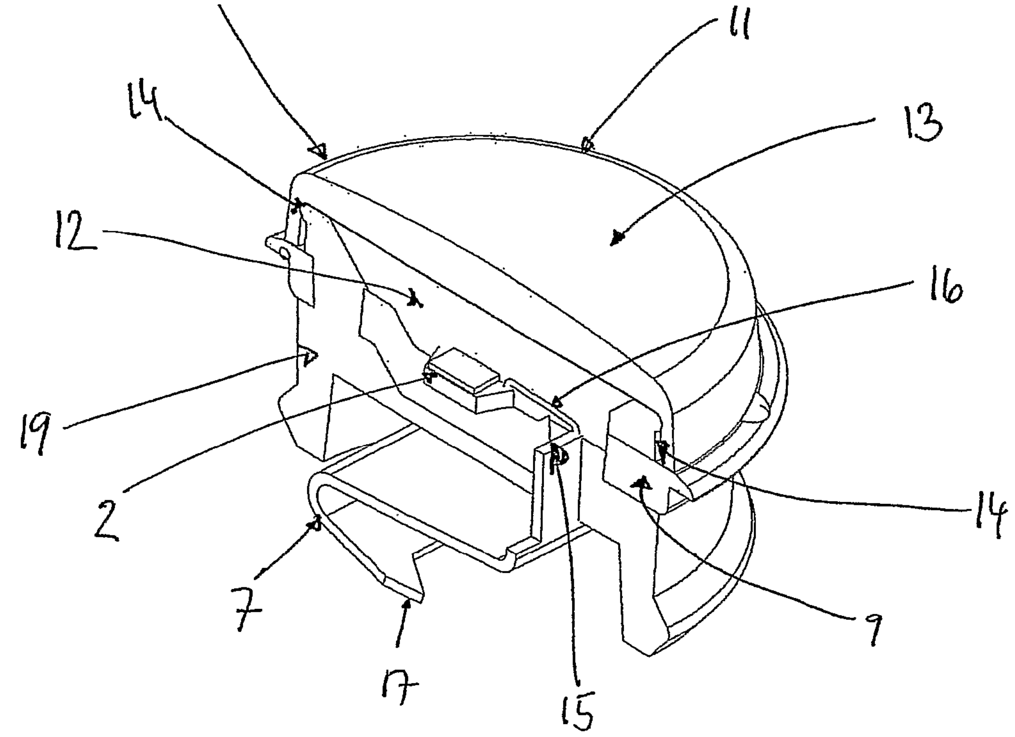
FIG. 4 shows an isometric sectional view of the adapter with cover.

On FIG. 4 is shown an embodiment of the adapter 1 where the watertight casing 11 is established as a combination of a material 12 moulded around the component 2 and a cover 13 provided with fastening means 14 that interact with corresponding fastening means 14 on the housing 19.

The invention claimed is:

1. An adapter with at least one electronic component for mounting in a hole extending through or partly through a composite board, which includes at least two layers of electrically conducting material that are separated by at least one insulator of electrically insulating material, the adapter including one or more legs adapted for by mounting in the hole to establish electric connection with a first layer, and where between the adapter and the board there is provided a watertight barrier, wherein the at least one component is fitted on a metal item corresponding to the hole which metal item has a contact surface, which is in electrically and thermally conducting connection with a contact surface on a second layer when the adapter is mounted in the hole.

2. An adapter with at least one electronic component for mounting in a hole extending entirely through a board which includes a layer of electrically conducting material, the adapter including one or more legs adapted to establish electric connection with an electric conductor by mounting in the hole, and where between the adapter and the board there is provided a watertight barrier, wherein the at least one component is fitted on a metal item corresponding to the hole which metal item has a contact surface, which is in electrically and thermally conducting connection with a contact surface on the layer when the adapter is mounted in the hole.

3. Adapter according to claim 1, wherein the component is a light diode.

4. Adapter according to claim 3, wherein the power of the light diode is at least 0.1 W, preferably a power from 0.3 W to 10 W.

5. Adapter according to claim 1, wherein the watertight barrier is a packing optionally selected among a rubber packing, an O-ring, and a fluid packing so as to constitute a watertight interference fit by interaction with the latter.

6. Adapter according to claim 1, wherein the component is provided with a watertight casing which optionally or in combination is established in that a material is moulded directly on the component or in that the component is enclosed by a cover which is located on the adapter by interacting fastening means.

7. Adapter according to claim 6, wherein the watertight casing is provided in transparent material with optical properties selected among reflectors, Fresnel lenses, holographic filters, light guides, coloured lenses, semi-transparent lenses or combinations of these.

8. Use of a combination of adapters according to claim 1, preferably in lighting fixtures, light signs, monochromic displays or RGB displays.

* * * * *